US012259455B2

(12) United States Patent
Lin et al.

(10) Patent No.: US 12,259,455 B2
(45) Date of Patent: Mar. 25, 2025

(54) CALIBRATING A BATTERY OF AN INFORMATION HANDLING SYSTEM

(71) Applicant: Dell Products L.P., Round Rock, TX (US)

(72) Inventors: Pei-Ying Lin, New Taipei (TW); Adolfo S. Montero, Pflugerville, TX (US); Chien-Hao Chiu, Taoyuan (TW); Shuo-Jung Chou, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 195 days.

(21) Appl. No.: 18/193,114

(22) Filed: Mar. 30, 2023

(65) Prior Publication Data

US 2024/0329178 A1 Oct. 3, 2024

(51) Int. Cl.
*G01R 35/00* (2006.01)
*G01R 31/3842* (2019.01)
*H02J 7/00* (2006.01)

(52) U.S. Cl.
CPC ....... *G01R 35/005* (2013.01); *G01R 31/3842* (2019.01); *H02J 7/00712* (2020.01)

(58) Field of Classification Search
CPC .. G01R 31/367; G01R 31/371; G01R 31/382; G01R 31/3842; G01R 35/005; H02J 7/0048; H02J 7/0047; H02J 7/005; H02J 7/0068; H02J 7/00714; H02J 7/00712; Y02D 10/00; G06F 1/3212
See application file for complete search history.

(56) References Cited

U.S. PATENT DOCUMENTS

| 9,831,700 | B2* | 11/2017 | Verdun | H02J 7/0069 |
| 11,112,461 | B2* | 9/2021 | Lim | H02J 7/00714 |
| 11,740,677 | B2* | 8/2023 | Thompson | G01R 31/371 |
| | | | | 320/127 |
| 11,990,782 | B2* | 5/2024 | Ning | H02J 7/00712 |

OTHER PUBLICATIONS

Xu, B., Oudalov, A., Ulbig, A., Andersson, G., & Kirschen, D. S. (2018). Modeling of Lithium-Ion Battery Degradation for Cell Life Assessment. IEEE Transactions on Smart Grid, 9(2), 1131-1140. doi: 10.1109/tsg.2016.2578950.

* cited by examiner

Primary Examiner — Vinh P Nguyen
(74) Attorney, Agent, or Firm — McDermott Will & Emery LLP

(57) ABSTRACT

Calibrating a battery including identifying a historical discharge rate of the battery; segmenting the historical discharge rate of the battery into regions; determining, based on the historical discharge rate of the battery, a first historical charge capacity of the battery for a first region and a second historical charge capacity of the battery for a second region; discharging, at an updated discharge rate, the battery from a first threshold voltage to a second threshold voltage; calculating, based on the updated discharge rate, a first updated charge capacity of the battery for the first region; determining a full charge capacity of the battery based on i) the first updated charge capacity of the battery for the first region and ii) the second historical charge capacity of the battery for the second region; adjusting a charging current of the battery based on the determined full charge capacity of the battery.

20 Claims, 7 Drawing Sheets

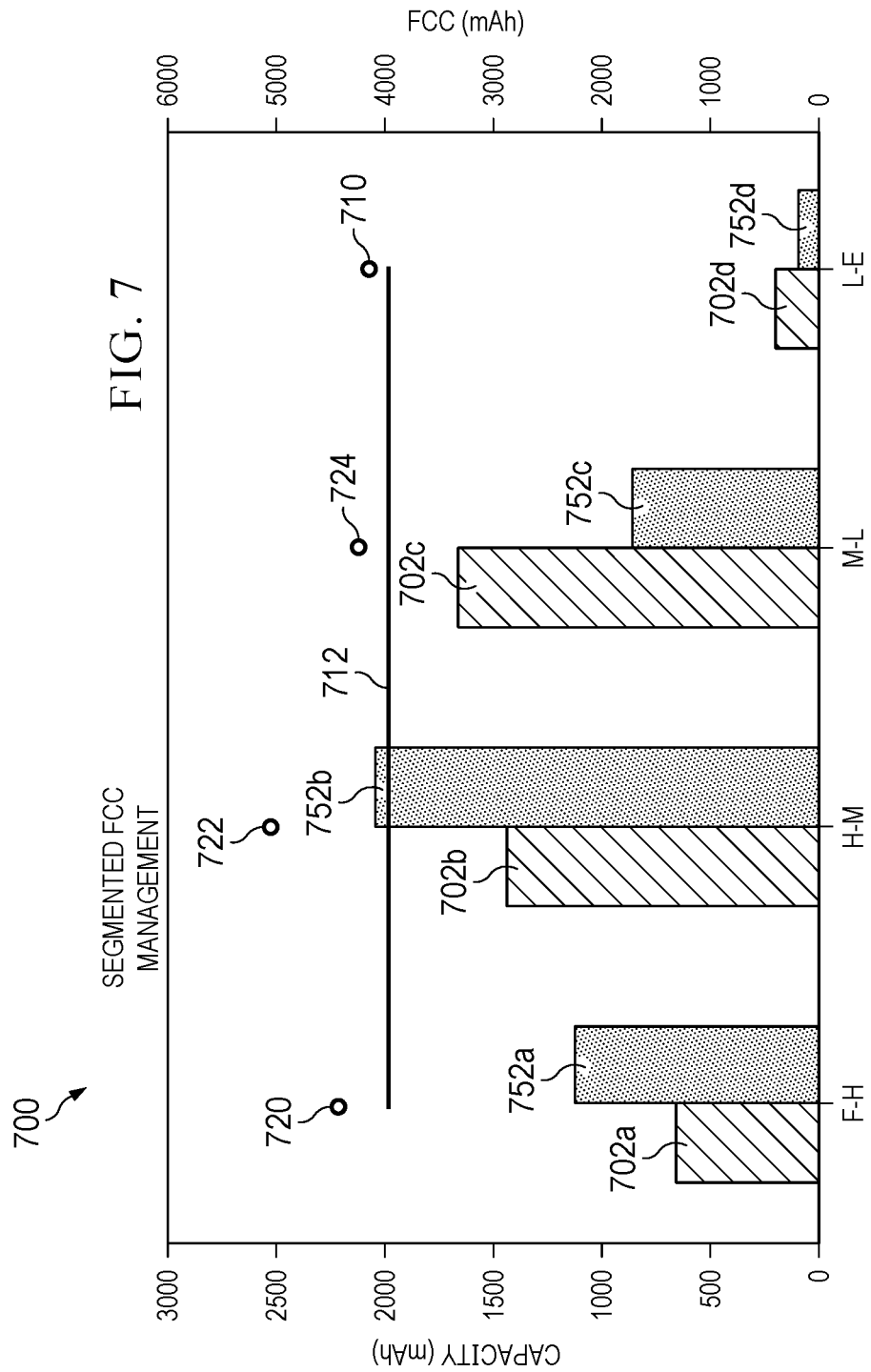

CALIBRATING A BATTERY OF AN INFORMATION HANDLING SYSTEM

BACKGROUND

Field of the Disclosure

The disclosure relates generally to an information handling system, and in particular, calibrating a battery of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a method of calibrating a battery of an information handling system, including identifying a historical discharge rate of the battery of the information handling system; segmenting the historical discharge rate of the battery into a first region and a second region, the first region defined between a first threshold voltage and a second threshold voltage, the second region defined between the second threshold voltage and a third threshold voltage, the first threshold voltage greater than the second threshold voltage, and the second threshold voltage greater than the third threshold voltage; determining, based on the historical discharge rate of the battery, a first historical charge capacity of the battery for the first region and a second historical charge capacity of the battery for the second region; discharging, at an updated discharge rate of the battery, the battery from the first threshold voltage to the second threshold voltage; in response to discharging the battery from the first voltage threshold to the second threshold voltage, calculating, based on the updated discharge rate of the battery, a first updated charge capacity of the battery for the first region; determining a full charge capacity of the battery based on i) the first updated charge capacity of the battery for the first region and ii) the second historical charge capacity of the battery for the second region; and adjusting a charging current of the battery based on the determined full charge capacity of the battery.

Other embodiments of these aspects include corresponding systems, apparatus, and computer programs, configured to perform the actions of the methods, encoded on computer storage devices.

These and other embodiments may each optionally include one or more of the following features. For instance, the first threshold voltage is associated with a full capacity of the battery. The third threshold voltage is associated with an empty capacity of the battery. Determining the full charge capacity of the battery further includes determining the full charge capacity of the battery based on a summation of the first updated charge capacity of the battery for the first region and the second historical charge capacity of the battery for the second region. Further segmenting the historical discharge rate of the battery into a third region, the third region defined between the third threshold voltage and a fourth threshold voltage, the third threshold voltage greater than the fourth threshold voltage; determining, based on the historical discharge rate of the battery, a third historical charge capacity of the battery for the third region; determining a full charge capacity of the battery based on i) the first updated charge capacity of the battery for the first region, ii) the second historical charge capacity of the battery for the second region, and iii) the third historical charge capacity of the battery for the third region; and adjusting the charging current of the battery based on the determined full charge capacity of the battery.

Further segmenting the historical discharge rate of the battery into a third region, the third region defined between the third threshold voltage and a fourth threshold voltage, the third threshold voltage greater than the fourth threshold voltage; determining, based on the historical discharge rate of the battery, a third historical charge capacity of the battery for the third region; discharging, at the updated discharge rate of the battery, the battery from the first threshold voltage to the third threshold voltage; in response to discharging the battery from the first voltage threshold to the third threshold voltage, calculating, based on the updated discharge rate of the battery, a second updated charge capacity of the battery for the second region; determining the full charge capacity of the battery based on i) the first updated charge capacity of the battery for the first region, ii) the second updated charge capacity of the battery for the second region, and ii) the third historical charge capacity of the battery for the third region; and adjusting the charging current of the battery based on the determined full charge capacity of the battery.

Further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage; determining, based on the historical discharge rate of the battery, a third historical charge capacity of the battery for the third region and a fourth historical charge capacity of the battery for the fourth region; discharging, at the updated discharge rate of the battery, the battery from the first threshold voltage to the second threshold voltage; in response to discharging the battery from the first voltage threshold to the second threshold voltage, calculating, based on the updated discharge rate of the battery, the first updated charge capacity of the battery for the first region; determining the full charge capacity of the battery based on i) the first updated charge capacity of the battery for the first region, ii) the second historical charge capacity of the battery for the second region, iii) the third historical charge capacity of the battery for the second region, and iv) the fourth historical charge capacity of the battery for the fourth region; and adjusting the charging current of the battery based on the determined full charge capacity of the battery.

Further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage; determining, based on the historical discharge rate of the battery, a third historical charge capacity of the battery for the third region and a fourth historical charge capacity of the battery for the fourth region; discharging, at the updated discharge rate of the battery, the battery from the first threshold voltage to the fifth threshold voltage; in response to discharging the battery from the first voltage threshold to the fifth threshold voltage, calculating, based on the updated discharge rate of the battery, a second updated charge capacity of the battery for the second region, a third updated charge capacity of the battery for the third region, and a fourth updated charge capacity of the battery for the fourth region; determining the full charge capacity of the battery based on i) the first updated charge capacity of the battery for the first region, ii) the second updated charge capacity of the battery for the second region, iii) the third updated charge capacity of the battery for the second region, and iv) the fourth updated charge capacity of the battery for the fourth region; and adjusting the charging current of the battery based on the determined full charge capacity of the battery.

Identifying a state of a status bit; determining that the state of the status bit is set; and in response to determining that the state of the status bit is set, determining whether the battery is in a direct-current (DC) mode; and determining that the battery is in the DC mode, and in response, segmenting the historical discharge rate of the battery. Identifying a state of a status bit; determining that the state of the status bit is set; and in response to determining that the state of the status bit is set, determining whether the battery is in a direct-current (DC) mode; and determining that the battery is not in DC mode, and in response, maintaining the charging current of the battery. Determining that the state of the status bit is not set; and in response to determining that the state of the status bit is not set, maintaining the charging current of the battery.

Particular implementations of the subject matter described in this specification can be implemented so as to realize one or more of the following advantages. For example, segmentation of a full charge capacity (FCC) of a battery of an information handling system allows more frequent FCC updates and more accurate FCC estimation following the battery behavior of each region/segment.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIGS. 5 and 7 illustrate respective graphs including charge capacities of the battery.

Figure 1:
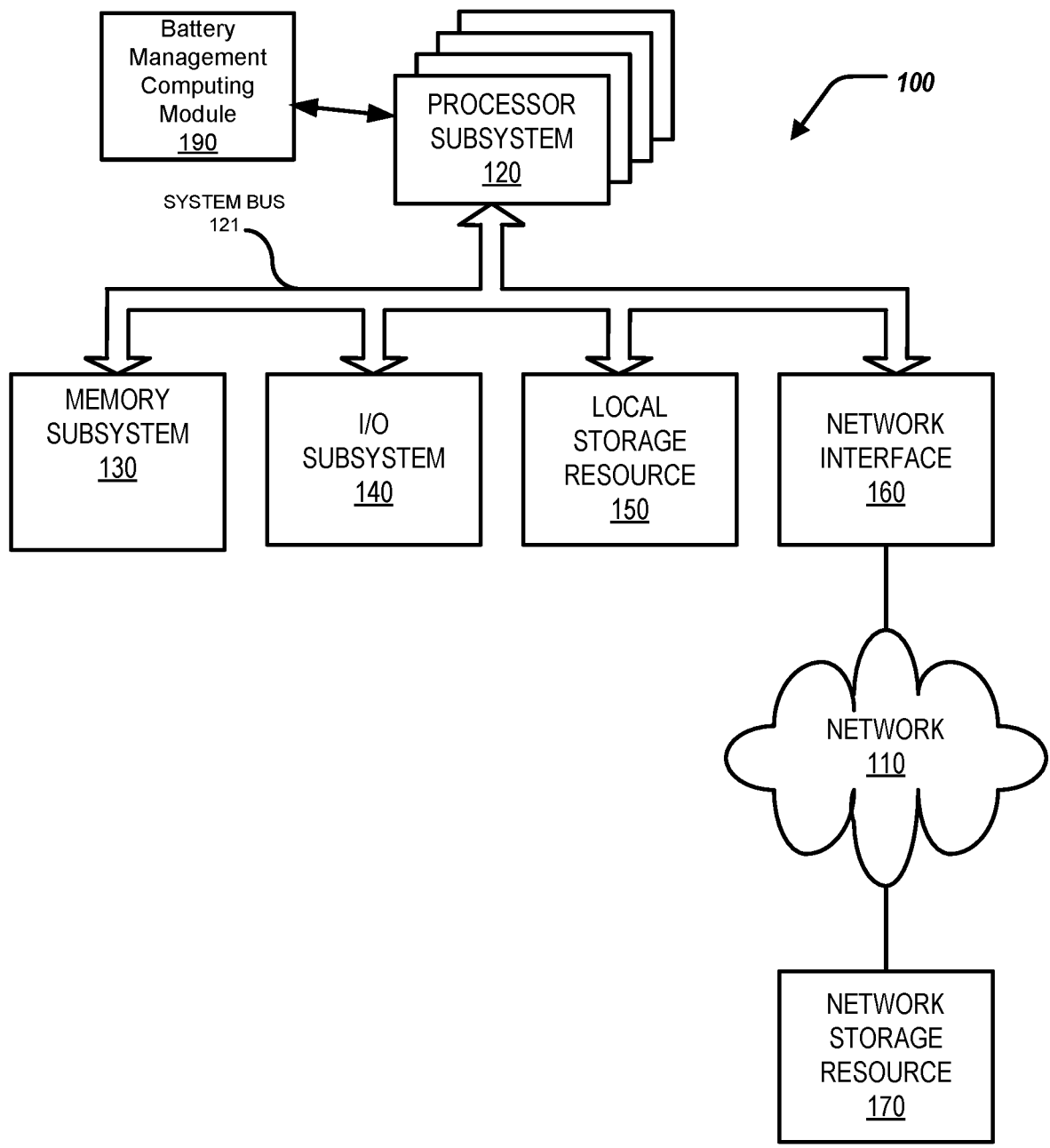
FIG. 1 is a block diagram of selected elements of an embodiment of an information handling system.

DESCRIPTION OF PARTICULAR
EMBODIMENT(S)

This disclosure discusses methods and systems for calibrating a battery of an information handling system. In short, partial learning of multiple regions/segments of a discharge/charge profile of the battery can be performed.

Specifically, this disclosure discusses a system and a method for calibrating a battery of an information handling system, comprising: identifying a historical discharge rate of the battery of the information handling system; segmenting the historical discharge rate of the battery into a first region and a second region, the first region defined between a first threshold voltage and a second threshold voltage, the second region defined between the second threshold voltage and a third threshold voltage, the first threshold voltage greater than the second threshold voltage, and the second threshold voltage greater than the third threshold voltage; determining, based on the historical discharge rate of the battery, a first historical charge capacity of the battery for the first region and a second historical charge capacity of the battery for the second region; discharging, at an updated discharge rate of the battery, the battery from the first threshold voltage to the second threshold voltage; in response to discharging the battery from the first voltage threshold to the second threshold voltage, calculating, based on the updated discharge rate of the battery, a first updated charge capacity of the battery for the first region; determining a full charge capacity of the battery based on i) the first updated charge capacity of the battery for the first region and ii) the second historical charge capacity of the battery for the second region; and adjusting a charging current of the battery based on the determined full charge capacity of the battery.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a battery management computing module 190. The battery management computing module 190 can be included by the processor subsystem 120, or in communication with the processor subsystem 120.

In short, the battery management computing module 190 can perform management of a battery of the information handling system 100. Specifically, the battery management computing module 190 can perform partial learning of multiple regions/segments of the discharge/charge profile of the battery.

Figure 2:
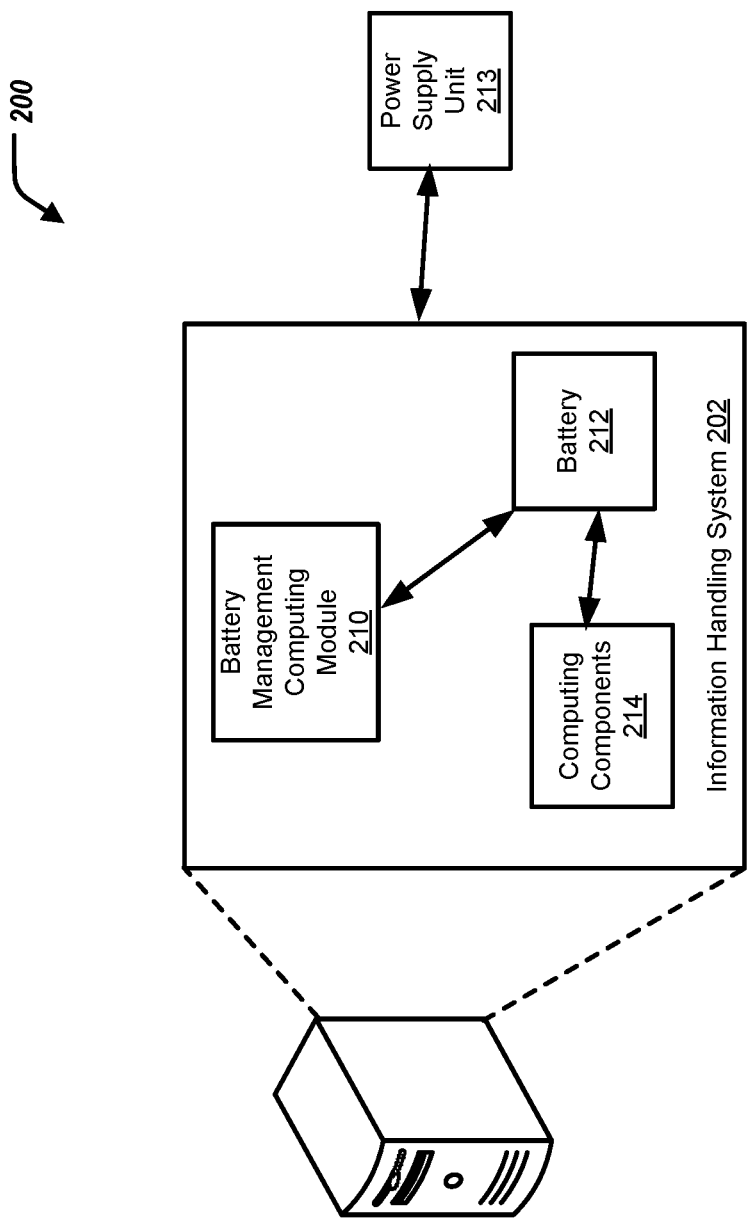
FIG. 2 illustrates a block diagram of an information handling system for calibrating a battery of the information handling system.

Turning to FIG. 2, FIG. 2 illustrates an environment 200 including an information handling system 202 and a power supply unit (PSU) 213. The information handling system 202 can include a battery management computing module 210, a battery 212, and computing modules 214. In some examples, the information handling system 202 is similar to, or includes, the information handling system 100 of FIG. 1. In some examples, the battery management computing module 210 is the same, or substantially the same, as the battery management computing module 190 of FIG. 1. In some examples, the computing components 214 are any computing component that draws power from the battery 212, including, for examples, the memory subsystem 130, the I/O subsystem 140, the local storage resource 150, the network interface 160, and/or the processor subsystem 120 of FIG. 1.

The battery management computing module 210 can be in communication with the battery 212. The computing components 214 can be in power communication with the battery 212.

The information handling system 202 can be in communication with the PSU 213. The PSU 213 can provide a charging current to the information handling system 202 to charge the battery 212. The charging current provided by the PSU 213 can be managed by the battery management computing module 190, described further herein.

Figure 3:
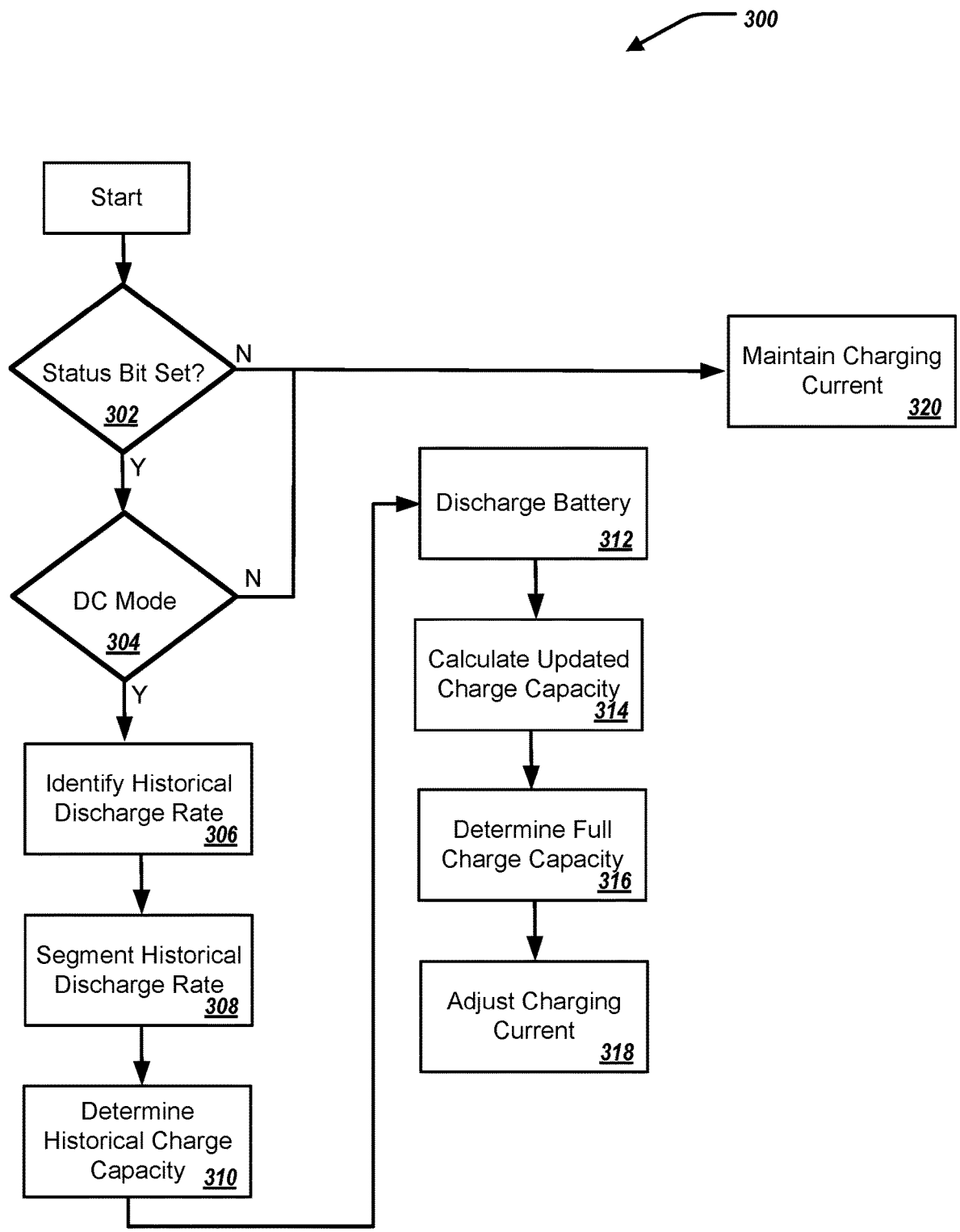
FIG. 3 illustrates a method for calibrating the battery of the information handling system.

In a first example, FIG. 3 illustrates a flowchart depicting selected elements of an embodiment of a method 300 for calibrating the battery 212 of the information handling system 100. The method 300 may be performed by the information handling system 100, the information handling system 202, and/or the battery management computing module 210, and with reference to FIGS. 1-2. It is noted that certain operations described in method 300 may be optional or may be rearranged in different embodiments.

The battery management computing module 210 can identify a state of a status bit, at 302. For example, the memory subsystem 130 can store data indicating the status bit. In some examples, the battery management computing module 210 can determine that the state of the status bit is set (at 302), and in response, determine whether the battery 212 is in a direct-current (DC) mode, at 304.

Figure 4:
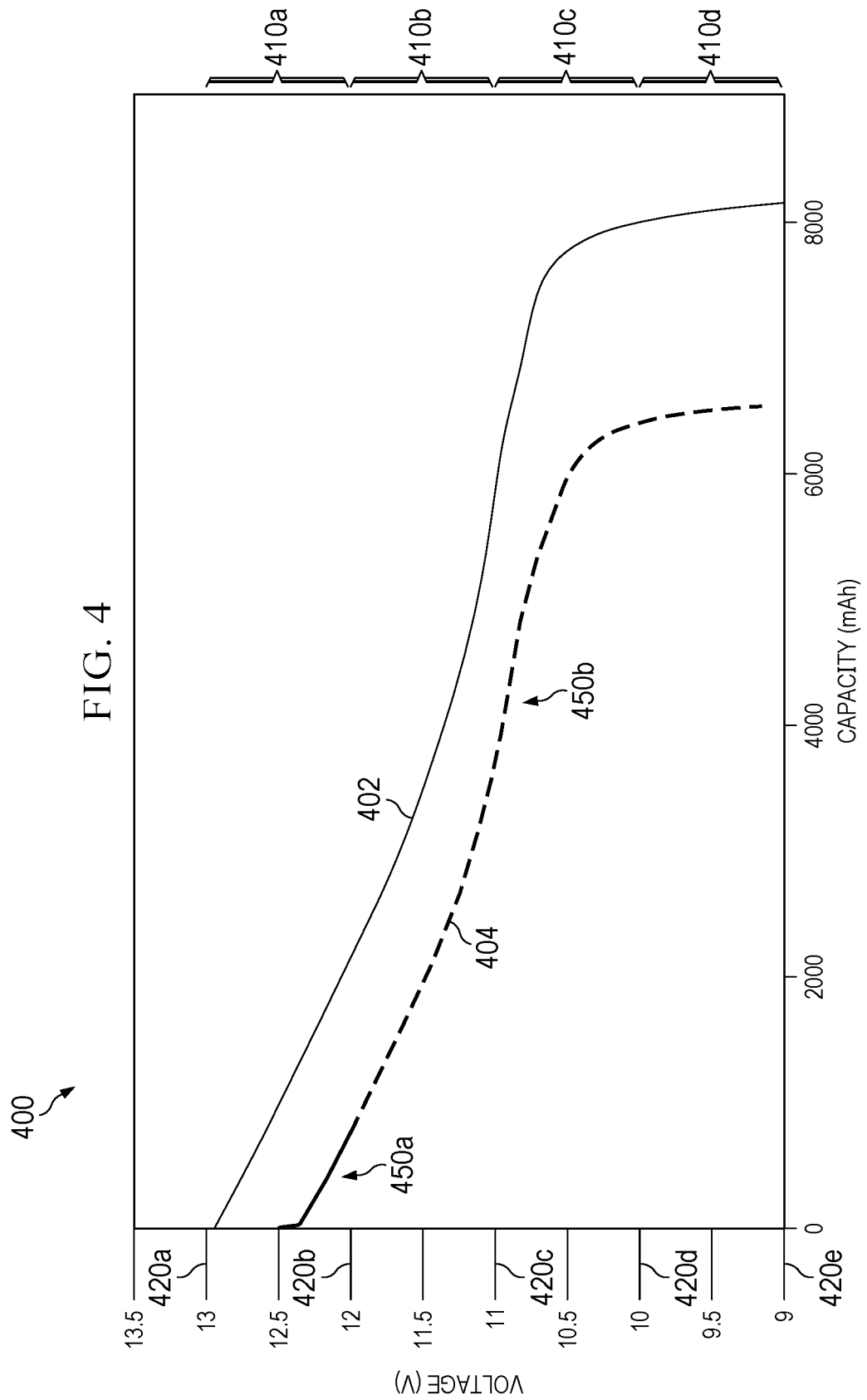
FIGS. 4 and 6 illustrate respective graphs including discharge rates of the battery.

In some examples, the battery management computing module 210 determines that the battery 212 is in DC mode (at 304) and in response, identifies a historical discharge rate of the battery 212, at 306. The historical discharge rate of the battery 212 is the historical rate at which the battery 212 is discharged. FIG. 4 illustrates a graph 400 illustrating an example historical discharge rate 402 of the battery 212. The historical discharge rate 402 is shown as a relationship of capacity (milliampere) on the x-axis and voltage (volts) on the y-axis.

The battery management computing module 210 segments the historical discharge rate 402 of the battery 212 into regions, at 308. Continuing the example, the battery management computing module 210 segments the historical discharge rate 402 into a first region 410a, a second region 410b, a third region 410c, and a fourth region 410d (collectively referred to as regions 410). The first region 410a is defined between a first threshold voltage 420a and a second threshold voltage 420b. The second region 410b is defined between the second threshold voltage 420b and a third threshold voltage 420c. The third region 410c is defined between the third threshold 420c and a fourth threshold 420d. The fourth region 410d is defined between the fourth threshold 420d and a fifth threshold 420e. The first threshold voltage 420a, the second threshold voltage 420b, the third threshold voltage 420c, the fourth threshold voltage 420d, and the fifth threshold voltage 420e are collectively referred to as threshold voltages 420

The first threshold voltage 420a is greater than the second threshold voltage 420b. The second threshold voltage 420b is greater than the third threshold voltage 420c. The third threshold voltage 420c is greater than the fourth threshold voltage 420d. The fourth threshold voltage 420d is greater than the fifth threshold voltage 420e. In the illustrated example, the first threshold voltage 420a is 13 volts; the second threshold voltage 420b is 12 volts; the third threshold voltage 420c is 11 volts; the fourth threshold voltage 420d is 10 volts; and the fifth threshold voltage is 9 volts.

In some examples, the threshold voltages 420 are based on chemical characteristics/chemical composition of the battery 212.

In some examples, the first threshold voltage 420a is associated with a full capacity of the battery 212. In some examples, the fifth threshold voltage 420e is associated with an empty capacity of the battery 212.

The battery management computing module 210 determines, based on the historical discharge rate 402 of the battery 212, historical charge capacities of the battery 212 for each of the regions 410, at 310. For example, the battery management computing module 210 determines, based on the historical discharge rate 402 of the battery 212, a first historical charge capacity of the battery 212 for the first region 410a. Specifically, the first historical charge capacity of the battery 212 for the first region 410a can be the difference in capacity between the capacity at the second threshold voltage 420b and the first threshold voltage 420a for the historical discharge rate 402. For example, the capacity of the battery 212 at the first threshold voltage 420a is approximately 0, and the capacity of the battery 212 at the second threshold voltage 420a is approximately 2100 mAh, resulting in the first historical charge capacity of the battery 212 as 2100 mAh.

For example, the battery management computing module 210 determines, based on the historical discharge rate 402 of the battery 212, a second historical charge capacity of the battery 212 for the second region 410b for the historical discharge rate 402. Specifically, the second historical charge capacity of the battery 212 for the second region 410b can be the difference in capacity between the capacity at the third threshold voltage 420c and the second threshold voltage 420b. For example, the capacity of the battery 212 at the second threshold voltage 420b approximately 2100 mAh, and the capacity of the battery 212 at the third threshold voltage 420c is approximately 6000 mAh, resulting in the second historical charge capacity of the battery 212 as 3900 mAh.

For example, the battery management computing module 210 determines, based on the historical discharge rate 402 of the battery 212, a third historical charge capacity of the battery 212 for the third region 410c for the historical discharge rate 402. Specifically, the third historical charge capacity of the battery 212 for the third region 410c can be the difference in capacity between the capacity at the fourth threshold voltage 420d and the third threshold voltage 420c. For example, the capacity of the battery 212 at the third threshold voltage 420c is approximately 6000 mAh, and the capacity of the battery 212 at the third threshold voltage 420c is approximately 8000 mAh, resulting in the third historical charge capacity of the battery 212 as 2000 mAh.

For example, the battery management computing module 210 determines, based on the historical discharge rate 402 of the battery 212, a fourth historical charge capacity of the battery 212 for the fourth region 410d for the historical discharge rate 402. Specifically, the fourth historical charge capacity of the battery 212 for the fourth region 410d can be the difference in capacity between the capacity at the fifth threshold voltage 420e and the fourth threshold voltage 420d. For example, the capacity of the battery 212 at the fourth threshold voltage 420d is approximately 8000 mAh, and the capacity of the battery 212 at the fifth threshold voltage 420e is approximately 8100 mAh, resulting in the fourth historical charge capacity of the battery 212 as 100 mAh.

Figure 5:
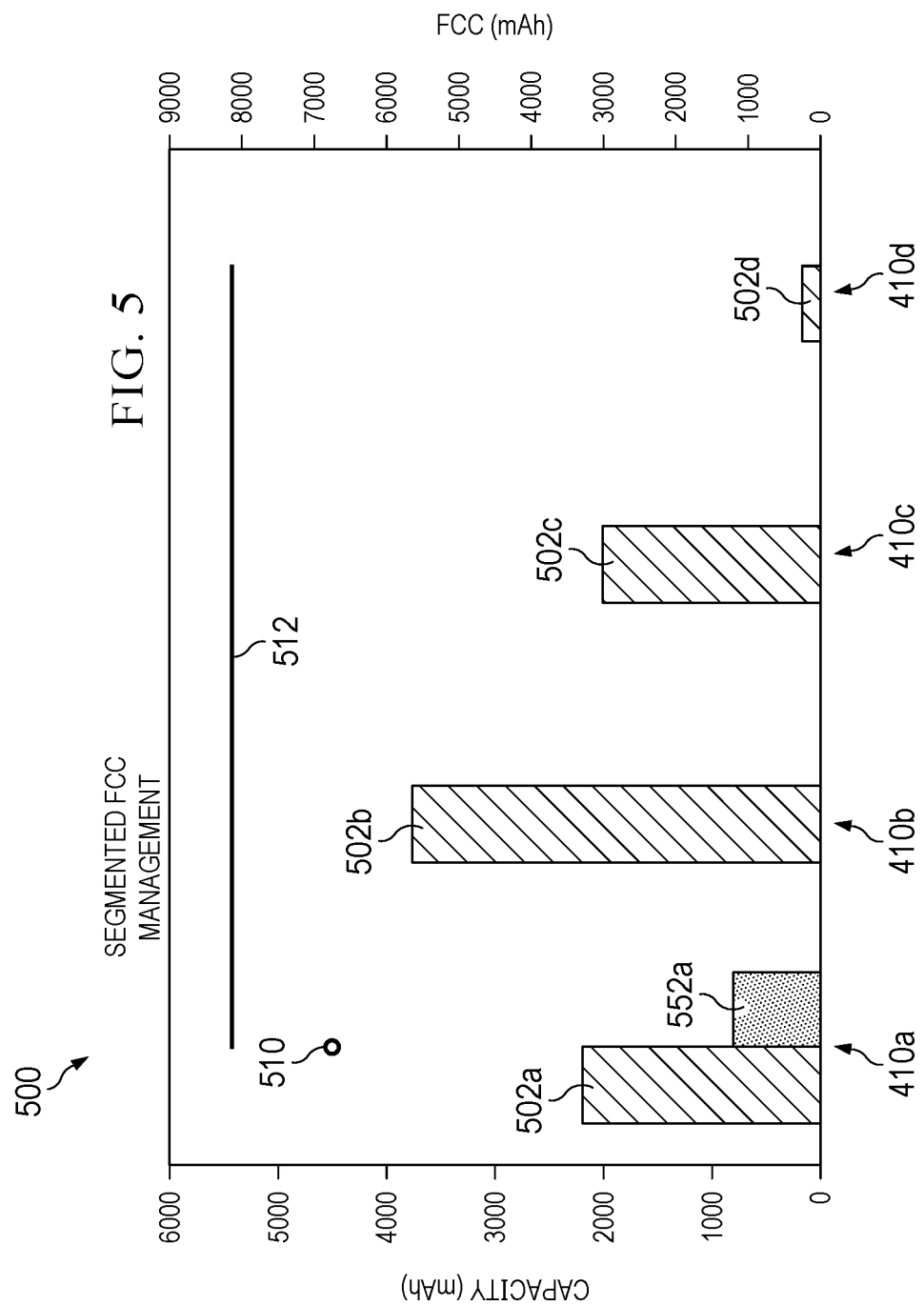

FIG. 5 illustrates a graph 500 illustrating the historical charge capacity of the battery 212 for each of the regions 410. For example, the first historical charge capacity of the battery 212 for the first region 410a is shown by 502a—2100 mAh. For example, the second historical charge capacity of the battery 212 for the second region 410b is shown by 502b—3900 mAh. For example, the third historical charge capacity of the battery 212 for the third region 410c is shown by 502c—2000 mAh. For example, the fourth historical charge capacity of the battery 212 for the fourth region 410d is shown by 502d—100 mAh.

Returning to FIG. 3, the battery 212 is discharged, at an updated discharge rate of the battery 212, from the first threshold voltage 420a to the second threshold voltage 420b, at 312. The battery 212 can be discharged in response to utilization by the computing components 214. The updated discharge rate of the battery 212 is a current (or active or recent) rate at which the battery 212 is discharged. FIG. 4 illustrates the graph 400 illustrating an example updated discharge rate 404 of the battery 212. The updated discharge rate 404 can include a portion 450a (solid-line) corresponding to the discharged portion of the battery 212 ("learned region") and a portion 450b (dotted-line) corresponding to the remaining capacity of the battery 212 ("unlearned region").

The battery management computing module 210 calculates, based on the updated discharge rate 404 of the battery 212, a first updated charge capacity of the battery 212 for the first region 410a, at 314. Specifically, the battery management computing module 210 calculates, in response to the discharge of the battery 212 from the first voltage threshold 420a to the second voltage threshold 420b, the first updated charge capacity of the battery 212 for the first region 410a. Specifically, the first updated charge capacity of the battery 212 for the first region 410a can be the difference in capacity between the capacity at the second threshold voltage 420b and the first threshold voltage 420a for the updated discharge rate 404. For example, the capacity of the battery 212 at the first threshold voltage 420a is approximately 0, and the capacity of the battery 212 at the second threshold voltage 420a is approximately 800 mAh, resulting in the first updated charge capacity of the battery 212 as 800 mAh.

In some examples, the battery management computing module 210 calculates the first updated charge capacity of the battery 212 for the first region 410 using Coulomb counting.

FIG. 5 illustrates the graph 500 illustrating the updated charge capacity of the battery 212 for the first region 410a. For example, the first updated charge capacity of the battery 212 for the first region 410a is shown by 552a—800 mAh.

The battery management computing module 210 determines the full charge capacity (FCC) of the battery 212, at 314. That is, the battery management computing module 210 determines the FCC of the battery 212 based on the updated charge capacities of the battery 212 and the historical charge capacity of the battery 212. Continuing the example, the battery management computing module 210 determines the FCC of the battery 212 based on i) the first updated charge capacity of the battery 212 for the first region 410a, ii) the second historical charge capacity of the battery 212 for the second region 410b, iii) the third historical charge capacity of the battery 212 for the third region 410c, and iv) the fourth historical charge capacity of the battery 212 for the fourth region 410d. The battery management computing module 210 determines the FCC of the battery 212 based on a summation of i) the first updated charge capacity of the battery 212 for the first region 410a, ii) the second historical charge capacity of the battery 212 for the second region 410b, iii) the third historical charge capacity of the battery 212 for the third region 410c, and iv) the fourth historical charge capacity of the battery 212 for the fourth region 410d. For example, the battery management computing module 210 determines the FCC of the battery 212 based on a summation of i) 800 mAh—the first updated charge capacity of the battery 212 for the first region 410a, ii) 3900 mAh—the second historical charge capacity of the battery 212 for the second region 410b, iii) 2000 mAh—the third historical charge capacity of the battery 212 for the third region 410c, and iv) 100-mAh the fourth historical charge capacity of the battery 212 for the fourth region 410d. Thus, the battery management computing module 210 determines the FCC of the battery 212 as 6800 mAh, shown as 510. Note that the FCC for the battery 212 is shown as a point above the first region 410a as only the charge capacity for the first region 410a—the first updated charge capacity—has been updated.

For context, the FCC based only on the historical charge capacity of the battery 212 is the summation of i) 2100 mAh—the first historical charge capacity of the battery 212 for the first region 410a, ii) 3900 mAh—the second historical charge capacity of the battery 212 for the second region 410b, iii) 2000 mAh—the third historical charge capacity of the battery 212 for the third region 410c, and iv) 100-mAh the fourth historical charge capacity of the battery 212 for the fourth region 410d. Thus, the battery management computing module 210 determines the FCC of the battery 212 as 8100 mAh, shown as 512.

The battery management computing module 210 adjusts the charging current of the battery 212 based on the determined full charge capacity of the battery 212, at 318. For example, the battery management computing 220 manages the charging current provided by the PSU 213 to the battery 212 to adjust such charging current. In some examples, the battery management computing module 220 increases the charging current provided by the PSU 213 to the battery 212 based on the determined full charging capacity of the battery 212. In some examples, the battery management computing module 220 decreases the charging current provided by the PSU 213 to the battery 212 based on the determined full charging capacity of the battery 212. In some examples, the battery management computing module 220 maintains the charging current provided by the PSU 213 to the battery 212 based on the determined full charging capacity of the battery 212.

In a second example, FIG. 3 illustrates a flowchart depicting selected elements of an embodiment of a method 300 for calibrating the battery 212 of the information handling system 100. The method 300 may be performed by the information handling system 100, the information handling system 202, and/or the battery management computing module 210, and with reference to FIGS. 1-2. It is noted that certain operations described in method 300 may be optional or may be rearranged in different embodiments.

The battery management computing module 210 can identify a state of a status bit, at 302. For example, the memory subsystem 130 can store data indicating the status bit. In some examples, the battery management computing module 210 can determine that the state of the status bit is set (at 302), and in response, determine whether the battery 212 is in a direct-current (DC) mode, at 304.

Figure 6:
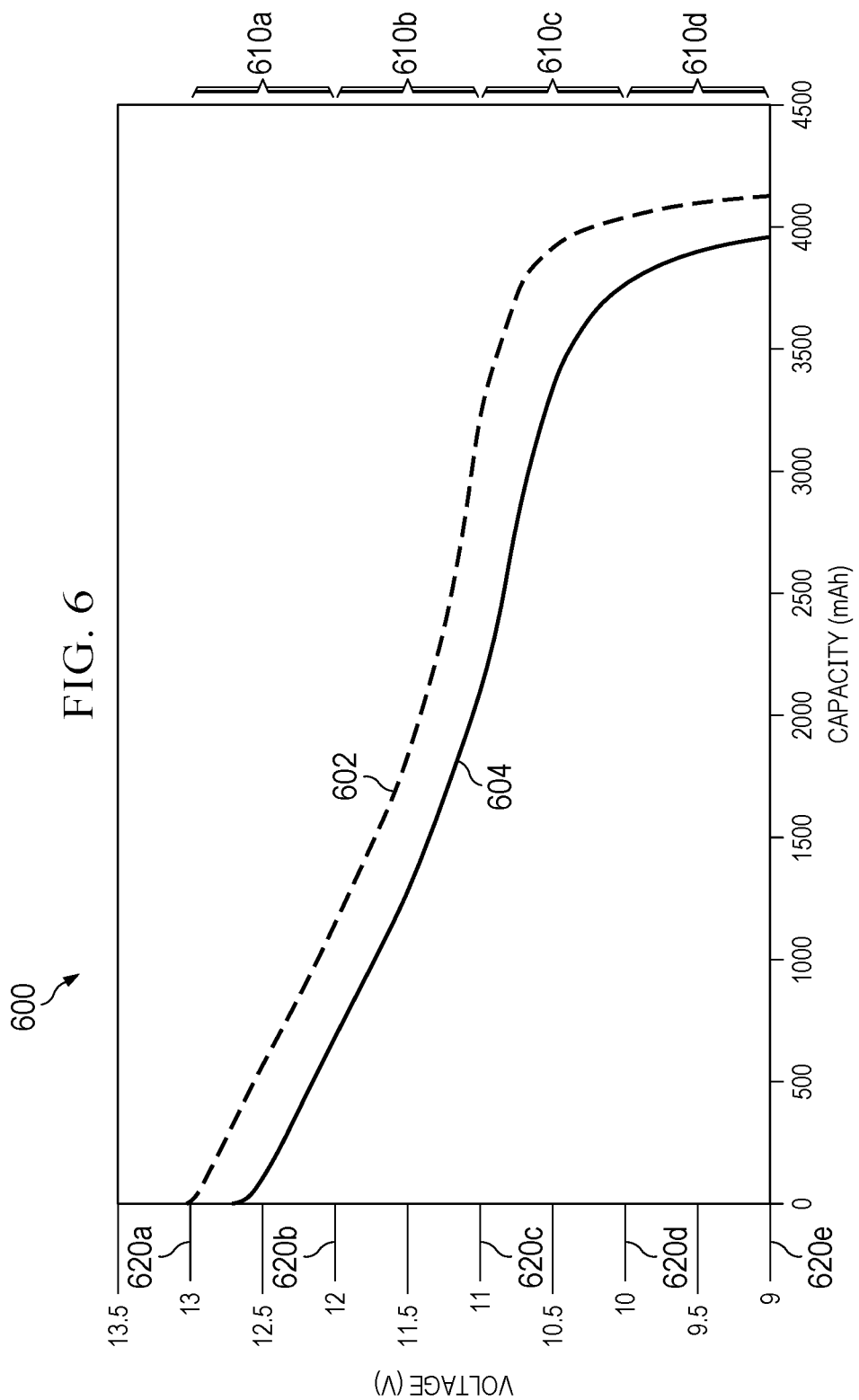

In some examples, the battery management computing module 210 determines that the battery 212 is in DC mode (at 304) and in response, identifies a historical discharge rate of the battery 212, at 306. The historical discharge rate of the battery 212 is the historical rate at which the battery 212 is discharged. FIG. 6 illustrates a graph 600 illustrating an example historical discharge rate 602 of the battery 212. The historical discharge rate 402 is shown as a relationship of capacity (milliampere) on the x-axis and voltage (volts) on the y-axis. In some examples, the historical discharge rate 602 corresponds to a temperature of the battery 212 of approximately 25 degrees Celsius.

The battery management computing module 210 segments the historical discharge rate 602 of the battery 212 into regions, at 308. Continuing the example, the battery management computing module 210 segments the historical discharge rate 602 into a first region 610a, a second region 610b, a third region 610c, and a fourth region 610d (collectively referred to as regions 610). The first region 610a is defined between a first threshold voltage 620a and a second threshold voltage 620b. The second region 610b is defined between the second threshold voltage 620b and a third threshold voltage 620c. The third region 610c is defined between the third threshold voltage 620c and a fourth threshold 620d. The fourth region 610d is defined between the fourth threshold 620d and a fifth threshold 620e. The first threshold voltage 620a, the second threshold voltage 620b, the third threshold voltage 620c, the fourth threshold voltage 620d, and the fifth threshold voltage 620e are collectively referred to as threshold voltages 620.

The first threshold voltage 620a is greater than the second threshold voltage 620b. The second threshold voltage 620b is greater than the third threshold voltage 620c. The third threshold voltage 620c is greater than the fourth threshold voltage 620d. The fourth threshold voltage 620d is greater than the fifth threshold voltage 620e. In the illustrated example, the first threshold voltage 620a is 13 volts; the second threshold voltage 620b is 12 volts; the third threshold voltage 620c is 11 volts; the fourth threshold voltage 620d is 10 volts; and the fifth threshold voltage 620e is 9 volts.

In some examples, the threshold voltages 620 are based on chemical characteristics/chemical composition of the battery 212.

In some examples, the first threshold voltage 620a is associated with a full capacity of the battery 212. In some examples, the fifth threshold voltage 620e is associated with an empty capacity of the battery 212.

The battery management computing module 210 determines, based on the historical discharge rate 602 of the battery 212, historical charge capacities of the battery 212 for each of the regions 610, at 310. For example, the battery management computing module 210 determines, based on the historical discharge rate 602 of the battery 212, a first historical charge capacity of the battery 612 for the first region 610a. Specifically, the first historical charge capacity of the battery 212 for the first region 610a can be the difference in capacity between the capacity at the second threshold voltage 620b and the first threshold voltage 620a for the historical discharge rate 602. For example, the capacity of the battery 212 at the first threshold voltage 620a is approximately 0, and the capacity of the battery 212 at the second threshold voltage 620b is approximately 600 mAh, resulting in the first historical charge capacity of the battery 212 as 600 mAh.

For example, the battery management computing module 210 determines, based on the historical discharge rate 602 of the battery 212, a second historical charge capacity of the battery 212 for the second region 610b for the historical discharge rate 602. Specifically, the second historical charge capacity of the battery 212 for the second region 610b can be the difference in capacity between the capacity at the third threshold voltage 620c and the second threshold voltage 620b. For example, the capacity of the battery 212 at the second threshold voltage 620b is approximately 600 mAh, and the capacity of the battery 212 at the third threshold voltage 620c is approximately 2000 mAh, resulting in the second historical charge capacity of the battery 212 as 1400 mAh.

For example, the battery management computing module 210 determines, based on the historical discharge rate 602 of the battery 212, a third historical charge capacity of the battery 212 for the third region 610c for the historical discharge rate 602. Specifically, the third historical charge capacity of the battery 212 for the third region 610c can be the difference in capacity between the capacity at the fourth threshold voltage 620d and the third threshold voltage 620c. For example, the capacity of the battery 212 at the third threshold voltage 620c is approximately 2000 mAh, and the capacity of the battery 212 at the fourth threshold voltage 620d is approximately 3700 mAh, resulting in the third historical charge capacity of the battery 212 as 1700 mAh.

For example, the battery management computing module 210 determines, based on the historical discharge rate 602 of the battery 212, a fourth historical charge capacity of the battery 212 for the fourth region 610d for the historical discharge rate 602. Specifically, the fourth historical charge capacity of the battery 212 for the fourth region 610d can be the difference in capacity between the capacity at the fifth threshold voltage 620e and the fourth threshold voltage 620d. For example, the capacity of the battery 212 at the fourth threshold voltage 620d is approximately 3700 mAh, and the capacity of the battery 212 at the fifth threshold voltage 620e is approximately 3900 mAh, resulting in the fourth historical charge capacity of the battery 212 as 200 mAh.

FIG. 7 illustrates a graph 700 illustrating the historical charge capacity of the battery 212 for each of the regions 610. For example, the first historical charge capacity of the battery 212 for the first region 610a is shown by 702a—600 mAh. For example, the second historical charge capacity of the battery 212 for the second region 610b is shown by 702b—1400 mAh. For example, the third historical charge capacity of the battery 212 for the third region 610c is shown by 702c—1700 mAh. For example, the fourth historical charge capacity of the battery 212 for the fourth region 610d is shown by 702d—200 mAh.

The battery 212 is discharged, at an updated discharge rate of the battery 212, from the first threshold voltage 620a to the fifth threshold voltage 620b, at 312. The battery 212 can be discharged in response to utilization by the computing components 214. The updated discharge rate of the battery 212 is a current (or active or recent) rate at which the battery 212 is discharged. FIG. 6 illustrates the graph 600 illustrating an example updated discharge rate 604 of the battery 212. In some examples, the updated discharge rate 604 corresponds to a temperature of the battery 212 of approximately 20 degrees Celsius.

The battery management computing module 210 calculates, based on the updated discharge rate 604 of the battery 212, a first updated charge capacity of the battery 212 for the first region 610a, at 314. Specifically, the battery management computing module 210 calculates, in response to discharge of the battery 212 from the first voltage threshold 620a to the second voltage threshold 620b, the first updated charge capacity of the battery 212 for the first region 610a. Specifically, the first updated charge capacity of the battery 212 for the first region 610a can be the difference in capacity between the capacity at the second threshold voltage 620b and the first threshold voltage 620a for the updated discharge rate 604. For example, the capacity of the battery 212 at the first threshold voltage 620a is approximately 0, and the capacity of the battery 212 at the second threshold voltage 620 is approximately 1200 mAh, resulting in the first updated charge capacity of the battery 212 as 1200 mAh.

The battery management computing module 210 calculates, in response to discharge of the battery 212 from the second voltage threshold 620b to the third voltage threshold 620c, the second updated charge capacity of the battery 212 for the second region 610b. Specifically, the second updated charge capacity of the battery 212 for the second region 610b can be the difference in capacity between the capacity at the third threshold voltage 620c and the second threshold voltage 620b for the updated discharge rate 604. For example, the capacity of the battery 212 at the second threshold voltage 620b is approximately 1200 mAh, and the capacity of the battery 212 at the third threshold voltage 620c is approximately 3200 mAh, resulting in the second updated charge capacity of the battery 212 as 2000 mAh.

The battery management computing module 210 calculates, in response to discharge of the battery 212 from the third voltage threshold 620c to the fourth voltage threshold 620d, the third updated charge capacity of the battery 212 for the third region 610c. Specifically, the third updated charge capacity of the battery 212 for the third region 610c can be the difference in capacity between the capacity at the fourth threshold voltage 620d and the third threshold voltage 620c for the updated discharge rate 604. For example, the capacity of the battery 212 at the third threshold voltage 620c is approximately 3200 mAh, and the capacity of the battery 212 at the fourth threshold voltage 620d is 4100 mAh, resulting in the second updated charge capacity of the battery 212 as 900 mAh.

The battery management computing module 210 calculates, in response to discharge of the battery 212 from the fourth voltage threshold 620d to the fifth voltage threshold 620e, the fourth updated charge capacity of the battery 212 for the fourth region 610d. Specifically, the fourth updated charge capacity of the battery 212 for the fourth region 610d can be the difference in capacity between the capacity at the fifth threshold voltage 620e and the fourth threshold voltage 620d for the updated discharge rate 604. For example, the capacity of the battery 212 at the fourth threshold voltage 620d is approximately 4100 mAh, and the capacity of the battery 212 at the fifth threshold voltage 620e is 4200 mAh, resulting in the second updated charge capacity of the battery 212 as 100 mAh.

In some examples, the battery management computing module 210 calculates the updated charge capacities of the battery 212 for each of the regions 410 using Coulomb counting.

FIG. 7 illustrates the graph 700 illustrating the updated charge capacities of the battery 212 for regions 410. For example, the first updated charge capacity of the battery 212 for the first region 610a is shown by 752a—1200 mAh; the second updated charge capacity of the battery 212 for the second region 610b is shown by 752b—2000 mAh; the third updated charge capacity of the battery 212 for the third region 610c is shown by 752c—900 mAh; and the fourth updated charge capacity of the battery 212 for the fourth region 610d is shown by 752d—100 mAh The battery management computing module 210 determines the full charge capacity (FCC) of the battery 212, at 314. That is, the battery management computing module 210 determines the FCC of the battery 212 based on the updated charge capacities of the battery 212 and the historical charge capacity of the battery 212. Continuing the example, the battery management computing module 210 determines the FCC of the battery 212 based on i) the first updated charge capacity of the battery 212 for the first region 610a, ii) the second updated charge capacity of the battery 212 for the second region 610b, iii) the third updated charge capacity of the battery 212 for the third region 610c, and iv) the fourth updated charge capacity of the battery 212 for the fourth region 610d. The battery management computing module 210 determines the FCC of the battery 212 based on a summation of i) the first updated charge capacity of the battery 212 for the first region 610a, ii) the second updated charge capacity of the battery 212 for the second region 610b, iii) the third updated charge capacity of the battery 212 for the third region 610c, and iv) the fourth updated charge capacity of the battery 212 for the fourth region 610d. For example, the battery management computing module 210 determines the FCC of the battery 212 based on a summation of i) 1200 mAh—the first updated charge capacity of the battery 212 for the first region 610a, ii) 2000 mAh—the second updated charge capacity of the battery 212 for the second region 610b, iii) 900 mAh—the third updated charge capacity of the battery 212 for the third region 610c, and iv)

100-mAh the fourth updated charge capacity of the battery 212 for the fourth region 610d. Thus, the battery management computing module 210 determines the FCC of the battery 212 as 4200 mAh, shown as 710.

For context, the FCC of the battery 212 based only the historical charge capacity of the battery 212 is the summation of i) 600 mAh—the first historical charge capacity of the battery 212 for the first region 610a, ii) 1400 mAh—the second updated charge capacity of the battery 212 for the second region 610b, iii) 1700 mAh—the third historical charge capacity of the battery 212 for the third region 610c, and iv) 200-mAh the fourth historical charge capacity of the battery 212 for the fourth region 610d. Thus, the battery management computing module 210 determines the FCC of the battery 212 as 3900 mAh, shown as 712.

The battery management computing module 210 adjusts the charging current of the battery 212 based on the determined full charge capacity of the battery 212. For example, the battery management computing 220 manages the charging current provided by the PSU 213 to the battery 212 to adjust such charging current. In some examples, the battery management computing module 220 increases the charging current provided by the PSU 213 to the battery 212 based on the determined full charging capacity of the battery 212. In some examples, the battery management computing module 220 decreases the charging current provided by the PSU 213 to the battery 212 based on the determined full charging capacity of the battery 212. In some examples, the battery management computing module 220 maintains the charging current provided by the PSU 213 to the battery 212 based on the determined full charging capacity of the battery 212.

Furthermore, in some examples, the battery management computing module 210 can determine the FCC of the battery 212 as the battery 212 is discharged. For example, the battery management computing module 210 determines the FCC of the battery 212 based on i) the first updated charge capacity of the battery 212 for the first region 610a, ii) the second historical charge capacity of the battery 212 for the second region 610b, iii) the third historical charge capacity of the battery 212 for the third region 610c, and iv) the fourth historical charge capacity of the battery 212 for the fourth region 610d. The battery management computing module 210 determines the FCC of the battery 212 based on a summation of i) the first updated charge capacity of the battery 212 for the first region 610a, ii) the second historical charge capacity of the battery 212 for the second region 610b, iii) the third historical charge capacity of the battery 212 for the third region 610c, and iv) the fourth historical charge capacity of the battery 212 for the fourth region 610d. For example, the battery management computing module 210 determines the FCC of the battery 212 based on a summation of i) 1200 mAh—the first updated charge capacity of the battery 212 for the first region 610a, ii) 1400 mAh—the second historical charge capacity of the battery 212 for the second region 610b, iii) 1700 mAh—the third historical charge capacity of the battery 212 for the third region 610c, and iv) 200-mAh the fourth historical charge capacity of the battery 212 for the fourth region 610d. Thus, the battery management computing module 210 determines the FCC of the battery 212 as 4500 mAh, shown as 720.

For example, the battery management computing module 210 determines the FCC of the battery 212 based on i) the first updated charge capacity of the battery 212 for the first region 610a, ii) the second updated charge capacity of the battery 212 for the second region 610b, iii) the third historical charge capacity of the battery 212 for the third region 610c, and iv) the fourth historical charge capacity of the battery 212 for the fourth region 610d. The battery management computing module 210 determines the FCC of the battery 212 based on a summation of i) the first updated charge capacity of the battery 212 for the first region 610a, ii) the second updated charge capacity of the battery 212 for the second region 610b, iii) the third historical charge capacity of the battery 212 for the third region 610c, and iv) the fourth historical charge capacity of the battery 212 for the fourth region 610d. For example, the battery management computing module 210 determines the FCC of the battery 212 based on a summation of i) 1200 mAh—the first updated charge capacity of the battery 212 for the first region 610a, ii) 2000 mAh—the second updated charge capacity of the battery 212 for the second region 610b, iii) 1700 mAh—the third historical charge capacity of the battery 212 for the third region 610c, and iv) 200-mAh the fourth historical charge capacity of the battery 212 for the fourth region 610d. Thus, the battery management computing module 210 determines the FCC of the battery 212 as 5100 mAh, shown as 722.

For example, the battery management computing module 210 determines the FCC of the battery 212 based on i) the first updated charge capacity of the battery 212 for the first region 610a, ii) the second updated charge capacity of the battery 212 for the second region 610b, iii) the third updated charge capacity of the battery 212 for the third region 610c, and iv) the fourth historical charge capacity of the battery 212 for the fourth region 610d. The battery management computing module 210 determines the FCC of the battery 212 based on a summation of i) the first updated charge capacity of the battery 212 for the first region 610a, ii) the second updated charge capacity of the battery 212 for the second region 610b, iii) the third updated charge capacity of the battery 212 for the third region 610c, and iv) the fourth historical charge capacity of the battery 212 for the fourth region 610d. For example, the battery management computing module 210 determines the FCC of the battery 212 based on a summation of i) 1200 mAh—the first updated charge capacity of the battery 212 for the first region 610a, ii) 2000 mAh—the second updated charge capacity of the battery 212 for the second region 610b, iii) 900 mAh—the third updated charge capacity of the battery 212 for the third region 610c, and iv) 200-mAh the fourth historical charge capacity of the battery 212 for the fourth region 610d. Thus, the battery management computing module 210 determines the FCC of the battery 212 as 4300 mAh, shown as 724.

Returning to FIG. 3, in some examples, the battery management computing module 210 can determine that the state of the status bit is not set (at 302), and in response, maintains the charging current of the battery 212, at 320. For example, the battery management computing module 210 maintains the charging current of the battery 212.

In some examples, the battery management computing module 210 determines that the battery 212 is in not DC mode (at 304) and in response, maintains the charging current of the battery 212, at 320. For example, the battery management computing module 210 maintains the charging current of the battery 212.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method of calibrating a battery of an information handling system, comprising:
   identifying a historical discharge rate of the battery of the information handling system;
   segmenting the historical discharge rate of the battery into a first region and a second region, the first region defined between a first threshold voltage and a second threshold voltage, the second region defined between the second threshold voltage and a third threshold voltage, the first threshold voltage greater than the second threshold voltage, and the second threshold voltage greater than the third threshold voltage;
   determining, based on the historical discharge rate of the battery, a first historical charge capacity of the battery for the first region and a second historical charge capacity of the battery for the second region;
   discharging, at an updated discharge rate of the battery, the battery from the first threshold voltage to the second threshold voltage;
   in response to discharging the battery from the first voltage threshold to the second threshold voltage, calculating, based on the updated discharge rate of the battery, a first updated charge capacity of the battery for the first region;
   determining a full charge capacity of the battery based on i) the first updated charge capacity of the battery for the first region and ii) the second historical charge capacity of the battery for the second region; and
   adjusting a charging current of the battery based on the determined full charge capacity of the battery.

2. The computer-implemented method of claim 1, wherein the first threshold voltage is associated with a full capacity of the battery.

3. The computer-implemented method of claim 1, wherein the third threshold voltage is associated with an empty capacity of the battery.

4. The computer-implemented method of claim 1, wherein determining the full charge capacity of the battery further includes determining the full charge capacity of the battery based on a summation of the first updated charge capacity of the battery for the first region and the second historical charge capacity of the battery for the second region.

5. The computer-implemented method of claim 1, further comprising:
   further segmenting the historical discharge rate of the battery into a third region, the third region defined between the third threshold voltage and a fourth threshold voltage, the third threshold voltage greater than the fourth threshold voltage;
   determining, based on the historical discharge rate of the battery, a third historical charge capacity of the battery for the third region;
   determining a full charge capacity of the battery based on i) the first updated charge capacity of the battery for the first region, ii) the second historical charge capacity of the battery for the second region, and iii) the third historical charge capacity of the battery for the third region; and
   adjusting the charging current of the battery based on the determined full charge capacity of the battery.

6. The computer-implemented method of claim 1, further comprising:
   further segmenting the historical discharge rate of the battery into a third region, the third region defined between the third threshold voltage and a fourth threshold voltage, the third threshold voltage greater than the fourth threshold voltage;
   determining, based on the historical discharge rate of the battery, a third historical charge capacity of the battery for the third region;
   discharging, at the updated discharge rate of the battery, the battery from the first threshold voltage to the third threshold voltage;
   in response to discharging the battery from the first voltage threshold to the third threshold voltage, calculating, based on the updated discharge rate of the battery, a second updated charge capacity of the battery for the second region;
   determining the full charge capacity of the battery based on i) the first updated charge capacity of the battery for the first region, ii) the second updated charge capacity of the battery for the second region, and ii) the third historical charge capacity of the battery for the third region; and
   adjusting the charging current of the battery based on the determined full charge capacity of the battery.

7. The computer-implemented method of claim 1, further comprising:
   further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage;
   determining, based on the historical discharge rate of the battery, a third historical charge capacity of the battery for the third region and a fourth historical charge capacity of the battery for the fourth region;

discharging, at the updated discharge rate of the battery, the battery from the first threshold voltage to the second threshold voltage;

in response to discharging the battery from the first voltage threshold to the second threshold voltage, calculating, based on the updated discharge rate of the battery, the first updated charge capacity of the battery for the first region;

determining the full charge capacity of the battery based on i) the first updated charge capacity of the battery for the first region, ii) the second historical charge capacity of the battery for the second region, iii) the third historical charge capacity of the battery for the second region, and iv) the fourth historical charge capacity of the battery for the fourth region; and adjusting the charging current of the battery based on the determined full charge capacity of the battery.

8. The computer-implemented method of claim 1, further comprising:

further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage;

determining, based on the historical discharge rate of the battery, a third historical charge capacity of the battery for the third region and a fourth historical charge capacity of the battery for the fourth region;

discharging, at the updated discharge rate of the battery, the battery from the first threshold voltage to the fifth threshold voltage;

in response to discharging the battery from the first voltage threshold to the fifth threshold voltage, calculating, based on the updated discharge rate of the battery, a second updated charge capacity of the battery for the second region, a third updated charge capacity of the battery for the third region, and a fourth updated charge capacity of the battery for the fourth region;

determining the full charge capacity of the battery based on i) the first updated charge capacity of the battery for the first region, ii) the second updated charge capacity of the battery for the second region, iii) the third updated charge capacity of the battery for the second region, and iv) the fourth updated charge capacity of the battery for the fourth region; and adjusting the charging current of the battery based on the determined full charge capacity of the battery.

9. The computer-implemented method of claim 1, further comprising:

identifying a state of a status bit;

determining that the state of the status bit is set; and in response to determining that the state of the status bit is set, determining whether the battery is in a direct-current (DC) mode; and determining that the battery is in the DC mode, and in response, segmenting the historical discharge rate of the battery.

10. The computer-implemented method of claim 1, further comprising:

identifying a state of a status bit;

determining that the state of the status bit is set; and in response to determining that the state of the status bit is set, determining whether the battery is in a direct-current (DC) mode; and determining that the battery is not in DC mode, and in response, maintaining the charging current of the battery.

11. The computer-implemented method of claim 1, further comprising:

identifying a state of a status bit;

determining that the state of the status bit is not set; and in response to determining that the state of the status bit is not set, maintaining the charging current of the battery.

12. An information handling system comprising a processor having access to memory media storing instructions executable by the processor to perform operations, comprising:

identifying a historical discharge rate of the battery of the information handling system;

segmenting the historical discharge rate of the battery into a first region and a second region, the first region defined between a first threshold voltage and a second threshold voltage, the second region defined between the second threshold voltage and a third threshold voltage, the first threshold voltage greater than the second threshold voltage, and the second threshold voltage greater than the third threshold voltage;

determining, based on the historical discharge rate of the battery, a first historical charge capacity of the battery for the first region and a second historical charge capacity of the battery for the second region;

discharging, at an updated discharge rate of the battery, the battery from the first threshold voltage to the second threshold voltage;

in response to discharging the battery from the first voltage threshold to the second threshold voltage, calculating, based on the updated discharge rate of the battery, a first updated charge capacity of the battery for the first region;

determining a full charge capacity of the battery based on i) the first updated charge capacity of the battery for the first region and ii) the second historical charge capacity of the battery for the second region; and adjusting a charging current of the battery based on the determined full charge capacity of the battery.

13. The information handling system of claim 12, wherein the first threshold voltage is associated with a full capacity of the battery.

14. The information handling system of claim 12, wherein the third threshold voltage is associated with an empty capacity of the battery.

15. The information handling system of claim 12, wherein determining the full charge capacity of the battery further includes determining the full charge capacity of the battery based on a summation of the first updated charge capacity of the battery for the first region and the second historical charge capacity of the battery for the second region.

16. The information handling system of claim 12, the operations further comprising:

further segmenting the historical discharge rate of the battery into a third region, the third region defined between the third threshold voltage and a fourth threshold voltage, the third threshold voltage greater than the fourth threshold voltage;

determining, based on the historical discharge rate of the battery, a third historical charge capacity of the battery for the third region;

determining a full charge capacity of the battery based on i) the first updated charge capacity of the battery for the first region, ii) the second historical charge capacity of the battery for the second region, and iii) the third historical charge capacity of the battery for the third region; and adjusting the charging current of the battery based on the determined full charge capacity of the battery.

17. The information handling system of claim 12, the operations further comprising:

further segmenting the historical discharge rate of the battery into a third region, the third region defined between the third threshold voltage and a fourth threshold voltage, the third threshold voltage greater than the fourth threshold voltage;

determining, based on the historical discharge rate of the battery, a third historical charge capacity of the battery for the third region;

discharging, at the updated discharge rate of the battery, the battery from the first threshold voltage to the third threshold voltage;

in response to discharging the battery from the first voltage threshold to the third threshold voltage, calculating, based on the updated discharge rate of the battery, a second updated charge capacity of the battery for the second region;

determining the full charge capacity of the battery based on i) the first updated charge capacity of the battery for the first region, ii) the second updated charge capacity of the battery for the second region, and ii) the third historical charge capacity of the battery for the third region; and adjusting the charging current of the battery based on the determined full charge capacity of the battery.

18. The information handling system of claim 12, the operations further comprising:

further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage;

determining, based on the historical discharge rate of the battery, a third historical charge capacity of the battery for the third region and a fourth historical charge capacity of the battery for the fourth region;

discharging, at the updated discharge rate of the battery, the battery from the first threshold voltage to the second threshold voltage;

in response to discharging the battery from the first voltage threshold to the second threshold voltage, calculating, based on the updated discharge rate of the battery, the first updated charge capacity of the battery for the first region;

determining the full charge capacity of the battery based on i) the first updated charge capacity of the battery for the first region, ii) the second historical charge capacity of the battery for the second region, iii) the third historical charge capacity of the battery for the second region, and iv) the fourth historical charge capacity of the battery for the fourth region; and adjusting the charging current of the battery based on the determined full charge capacity of the battery.

19. The information handling system of claim 12, the operations further comprising:

further segmenting the historical discharge rate of the battery into a third region and a fourth region, the third region defined between the third threshold voltage and a fourth threshold voltage, the fourth region defined between the fourth threshold voltage and a fifth threshold voltage, the third threshold voltage greater than the fourth threshold voltage, and the fourth threshold voltage greater than the fifth threshold voltage;

determining, based on the historical discharge rate of the battery, a third historical charge capacity of the battery for the third region and a fourth historical charge capacity of the battery for the fourth region;

discharging, at the updated discharge rate of the battery, the battery from the first threshold voltage to the fifth threshold voltage;

in response to discharging the battery from the first voltage threshold to the fifth threshold voltage, calculating, based on the updated discharge rate of the battery, a second updated charge capacity of the battery for the second region, a third updated charge capacity of the battery for the third region, and a fourth updated charge capacity of the battery for the fourth region;

determining the full charge capacity of the battery based on i) the first updated charge capacity of the battery for the first region, ii) the second updated charge capacity of the battery for the second region, iii) the third updated charge capacity of the battery for the second region, and iv) the fourth updated charge capacity of the battery for the fourth region; and adjusting the charging current of the battery based on the determined full charge capacity of the battery.

20. A non-transitory computer-readable medium storing software comprising instructions executable by one or more computers which, upon such execution, cause the one or more computers to perform operations comprising:

identifying a historical discharge rate of the battery of the information handling system;

segmenting the historical discharge rate of the battery into a first region and a second region, the first region defined between a first threshold voltage and a second threshold voltage, the second region defined between the second threshold voltage and a third threshold voltage, the first threshold voltage greater than the second threshold voltage, and the second threshold voltage greater than the third threshold voltage;

determining, based on the historical discharge rate of the battery, a first historical charge capacity of the battery for the first region and a second historical charge capacity of the battery for the second region;

discharging, at an updated discharge rate of the battery, the battery from the first threshold voltage to the second threshold voltage;

in response to discharging the battery from the first voltage threshold to the second threshold voltage, calculating, based on the updated discharge rate of the battery, a first updated charge capacity of the battery for the first region;

determining a full charge capacity of the battery based on i) the first updated charge capacity of the battery for the first region and ii) the second historical charge capacity of the battery for the second region; and adjusting a charging current of the battery based on the determined full charge capacity of the battery.

* * * * *